United States Patent
Koo (10) Patent No.: US 6,236,588 B1
(45) Date of Patent: May 22, 2001

(54) NONVOLATILE FERROELECTRIC RANDOM ACCESS MEMORY DEVICE AND A METHOD OF READING DATA THEREOF

(75) Inventor: Bon-Jae Koo, Inchun (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/546,552

(22) Filed: Apr. 10, 2000

(30) Foreign Application Priority Data

Jul. 28, 1999 (KR) .................................................. 99-30873

(51) Int. Cl.[7] .................................................. G11C 11/22
(52) U.S. Cl. .......................................... 365/145; 365/210
(58) Field of Search ................................... 365/210, 145, 365/149, 205, 207, 208

(56) References Cited

U.S. PATENT DOCUMENTS

| | | | |
|---|---|---|---|
| 5,218,566 | 6/1993 | Papaliolios | 365/145 |
| 5,345,414 | 9/1994 | Nakamura | 365/145 |
| 5,519,812 | 5/1996 | Ishihara | 395/24 |
| 5,541,872 | 7/1996 | Lowrey et al. | 365/145 |
| 5,663,904 | * 9/1997 | Arase | 365/145 |
| 5,751,626 | 5/1998 | Seyyedy | 365/145 |
| 5,753,949 | 5/1998 | Honma et al. | 257/309 |
| 5,844,832 | * 12/1998 | Kim | 365/145 |
| 5,969,979 | * 10/1999 | Hirano | 365/145 |
| 5,969,982 | * 10/1999 | Koo | 365/145 |
| 6,046,926 | * 4/2000 | Tanaka et al. | 365/145 |

* cited by examiner

Primary Examiner—Son Mai
(74) Attorney, Agent, or Firm—Jones Volentine, L.LC.

(57) ABSTRACT

A ferroelectric random access memory device is disclosed, which comprises a bit line, a reference bit line, a memory cell, a sense amplifier, and a voltage-supplying circuit. The reference bit line corresponds to the first bit line and has a reference voltage; the memory cell is coupled to the bit line; the sense amplifier operates to sense a voltage difference between the bit line and the reference bit line; and the voltage-supplying circuit operates to supply the bit line and the reference bit line with the same amount of charge before the sense amplifier is activated. According to the present invention, a voltage induced on a bit line during a sensing operation can be maintained at a high level regardless of the an increase in the degree of integration on the ferroelectric random access memory.

17 Claims, 4 Drawing Sheets

NONVOLATILE FERROELECTRIC RANDOM ACCESS MEMORY DEVICE AND A METHOD OF READING DATA THEREOF

This application relies for priority upon Korean Patent Application No. 99-30873, filed on Jul. 28, 1999, the contents of which are herein incorporated by reference in their entirety.

FIELD OF THE INVENTION

The present invention relates to nonvolatile semiconductor memory devices, and more particularly to a nonvolatile ferroelectric random access memory device and a related data reading method.

BACKGROUND OF THE INVENTION

A ferroelectric random access memory (hereinafter, referred to as an "FPAM") uses a ferroelectric capacitor as a storage element for each of a plurality of memory cells. Each memory cell stores a logic value based on the electrical polarization of the ferroelectric capacitor. The ferroelectric capacitor includes two electrodes (or plates) and a dielectric between the two electrodes that comprises a ferroelectric material such as lead zirconate titanate (PZT). When a voltage is applied across the electrodes of the ferroelectric capacitor, the ferroelectric material is polarized in the direction of the electric field. The switching threshold voltage for changing the polarization state of the ferroelectric capacitor is defined as the coercive voltage.

If the voltage applied to the capacitor is greater than its coercive voltage, then the ferroelectric capacitor may change its polarization state depending upon the polarity of the applied voltage. The FRAM retains its polarization state after power is removed, thus providing nonvolatility in the FRAM memory device. The ferroelectric capacitor can be switched between polarization states in about one nanosecond, which is faster than the programming time of most other nonvolatile memories such as Erasable Programmable Read Only Memories (EPROMs), Electrically Erasable Programmable Read Only Memories (EEPROMs), or flash EEPROMs.

In an FRAM memory device, a first electrode of the ferroelectric capacitor is coupled to a bit line via an access transistor and a second electrode of the ferroelectric capacitor is coupled to a plate line (or drive line), as is disclosed in U.S. Pat. No. 5,751,626, entitled "FERROELECTRIC MEMORY USING FERROELECTRIC REFERENCE CELLS", which is hereby incorporated by reference in its entirety.

Figure 1:
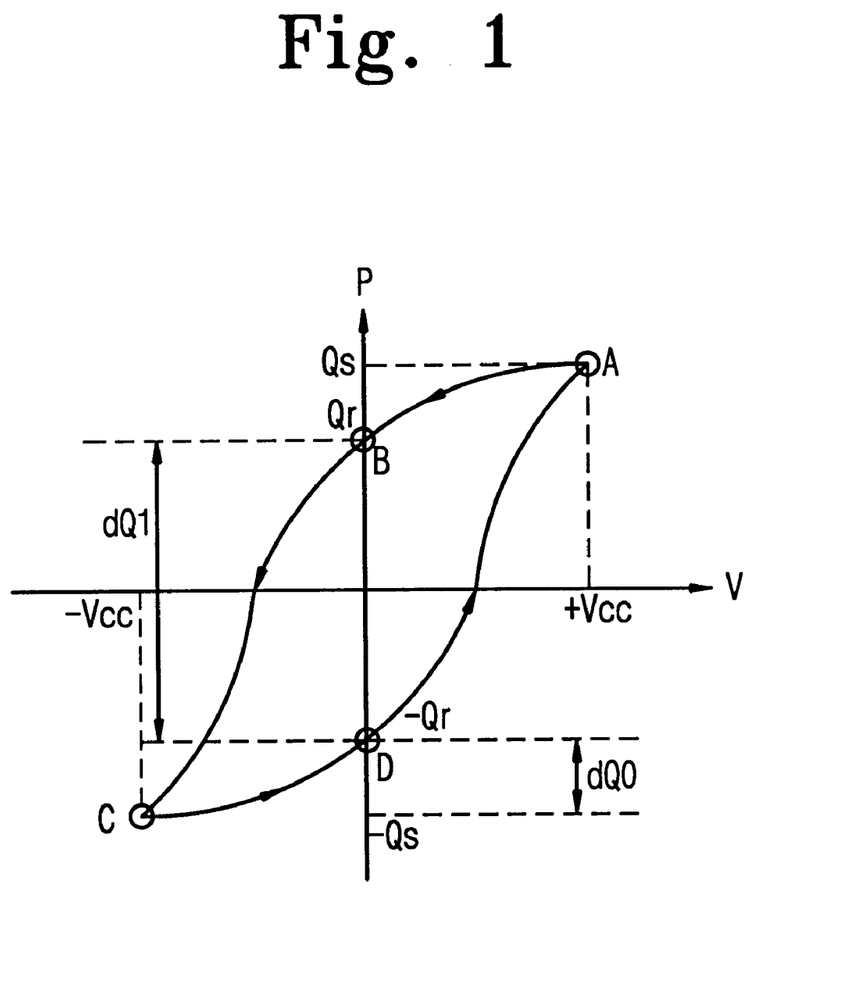
FIG. 1 is a graph showing a hysterisis I–V switching loop of a ferroelectric capacitor.

FIG. 1 is a graph showing a hysterisis I–V switching loop of a ferroelectric capacitor. In this graph, the abscissa indicates a potential difference between both electrodes of the ferroelectric capacitor, i.e., a voltage between the two electrodes of the capacitor, and the ordinate indicates the amount of charge induced at a surface of the ferroelectric material in accordance with spontaneous polarization, i.e., the degree of polarization ($\mu C/cm^2$). In the FRAM, a binary data signal corresponds to the points B and D of the hysterisis loop shown in FIG. 1. Logical "one" ("1") corresponds to point B, and logical "zero" ("0") corresponds to point D. A read operation of the FRAM will be described below with reference to FIG. 1.

At an initial stage of the read operation of the FRAM, an operation for sensing data stored in memory cells is carried out. Before the sensing operation, a bit line coupled to a memory cell is grounded. Then, during the sensing operation, the bit line is maintained in a floating state. The access transistor of the memory cell is then turned on by a word line so that the zero voltage on the bit line is applied to a first electrode of the corresponding ferroelectric capacitor, and a pulse signal of, for example, $V_{cc}$ level is applied to the second electrode of the ferroelectric capacitor. At this time, if a logical data "1" is stored in the ferroelectric capacitor, the degree of polarization of the capacitor is varied from the point B to the point D through the point C. As a result, a charge amount of $dQ_1$ is transmitted from the ferroelectric capacitor to the bit line, and thereby the voltage on the bit line is increased.

Conversely, if a logical data "0" is stored in the capacitor, the degree of polarization of the capacitor is varied from the point D to the point C, by the generation of a charge amount of $dQ_0$, and returns to the point D. In this case, the voltage on the bit line is not changed. The bit line voltage is compared with a reference voltage by means of a sense amplifier circuit. If the bit line voltage is more than the reference voltage, it is increased up to an operational voltage level (i.e., $V_{cc}$ level) by a sense amplifier circuit. If not, the bit line voltage is lowered to zero voltage by the sense amplifier circuit.

However, as the degree of integration of the FRAM increases, the dimensions of each ferroelectric capacitor in a flat board structure decrease. Unlike a dynamic random access memory (DRAM) using a linear capacitor of a capacitor-on-bit line (COB) structure that is capable of increasing the dimensions of the capacitor, it may be very difficult to increase the dimensions of the ferroelectric capacitor using the present manufacturing technology. As a result of a reduction of the dimensions of the capacitor, a corresponding reduction occurs to a voltage $V_b$ induced on the bit line during the sensing operation. The voltage $V_b$ is expressed as follow.

$$V_b = \frac{Q_m}{C_b} \quad (1)$$

In equation (1), $Q_m$ indicates the amount of charge transmitted from the ferroelectric capacitor of the memory cell to the bit line coupled to the memory cell, and $C_b$ indicates a bit line capacitance. $Q_m$ is applied to both $dQ_1$ and $dQ_0$.

The amount of charge $Q_m$ from the ferroelectric capacitor is decreased as the dimensions of the ferroelectric capacitor are reduced. Therefore, it can be seen from the equation that the bit line voltage $V_b$, which is induced during the sensing operation, is reduced in proportion to the reduced amount of charge. As the bit line voltage $V_b$ is reduced, it can be easily changed through a capacitive coupling at voltage variations of adjacent signal lines (e.g., the bit lines, the word lines and the plate lines). This can in turn cause a malfunction of the sense amplifier circuit or of the FRAM itself.

SUMMARY OF THE INVENTION

It is therefore an object of the present invention to provide a ferroelectric random access memory device capable of increasing a bit line voltage during a sensing operation and a read method thereof.

In order to attain the above object, according to an aspect of the present invention, a random access memory device is provided that comprises a top bit line, a top memory cell coupled to the top bit line, a bottom bit line corresponding to the top bit line, a sense amplifier coupled to the top and bottom bit lines, for sensing a voltage difference between the top and bottom bit lines, and a circuit for increasing a voltage of the top and bottom bit lines, before the sense amplifier is activated.

The circuit for increasing a voltage preferably comprises a first capacitor having a first electrode coupled to a first plate line, a first transistor having a first current path formed between the top bit line and a second electrode of the first capacitor, and a gate coupled to a first word line, a second capacitor having a first electrode coupled to a second plate line, and a second transistor having a current path formed between the bottom bit line and a second electrode of the second capacitor, and a gate coupled to a second word line.

The top memory cell preferably comprises a ferroelectric capacitor. The first and second capacitors preferably each comprise a capacitor selected from the group of a ferroelectric capacitor and a linear capacitor.

When the first and second capacitors comprise ferroelectric capacitors, a pulse signal is preferably applied simultaneously to the second electrodes of the first and second capacitors through corresponding first and second NMOS transistors after an inactivation of the first and second word lines, so that the first and second capacitors are polarized to an initial domain.

The first and second word lines are preferably activated simultaneously during a sensing operation. The first and second plate lines are preferably activated simultaneously during an activation of the first and second word lines.

The random access memory device may further comprise a bottom reference cell that is coupled to the bottom bit line and which provides the bottom bit line with a reference voltage.

The random access memory device may further comprise a bottom memory cell coupled to the bottom bit line, and a top reference cell that is coupled to the top bit line and which provides the top bit line with a reference voltage. Preferably, when the top memory cell and the bottom reference cell are activated, the bottom memory cell and the top reference cell are deactivated, and when the bottom memory cell and the top reference cell are activated, the top memory cell and the bottom reference cell are deactivated.

According to another aspect of this invention, a random access memory device is provide that comprises a top memory cell array having a plurality of top word lines, a plurality of top bit lines, and a plurality of top memory cells arranged in a matrix form between the top word lines and the top bit lines, a plurality of bottom bit lines corresponding to the top bit lines, a bottom reference cell array having a plurality of bottom reference cells commonly coupled to a bottom reference word line, for generating first reference voltages to be supplied into the bottom bit lines, a row decoder circuit for selecting a top word line related to a memory cell to be selected and the bottom reference word line in response to address signals, a sense amplifier circuit connected to the top and bottom bit lines, for sensing a voltage difference between corresponding top and bottom bit lines, and a charge dumping circuit for supplying the top and bottom bit lines with the same amount of charge before the sense amplifier circuit performs a sensing operation.

The random access memory device may further comprise a bottom memory cell array connected to the bottom bit lines and having a plurality of bottom word lines and a plurality of bottom memory cells arranged in a matrix form between the bottom word lines and the bottom bit lines, and a top reference cell array connected to the top bit lines and having a plurality of top reference cells commonly coupled to a top reference word line, for generating second reference voltages to be supplied into the top bit lines, respectively.

The top and bottom memory cells and the top and bottom reference cells preferably each comprise a ferroelectric capacitor.

The charge dumping circuit preferably comprises a first charge dumping portion coupled to the first bit lines and a second charge dumping portion coupled to the second bit lines.

The first charge dumping portion preferably comprises a plurality of first capacitors and a first plurality of access transistors, corresponding to the plurality of first bit lines; each of the first capacitors preferably has a first electrode coupled to a first plate line; and each of the first access transistors preferably has a current path formed between a corresponding first bit line and a second electrode of a corresponding first capacitor, and has a gate coupled to a third word line.

The second charge dumping portion preferably comprises a plurality of second capacitors and a plurality of second access transistors, corresponding to the second bit lines; each of the second capacitors preferably has a first electrode coupled to a second plate line; and of the second access transistors preferably has a current path formed between a corresponding second bit line and a second electrode of a corresponding second capacitor, and has a gate coupled to a fourth word line.

Each of the first and second capacitors preferably comprises a ferroelectric capacitor. In addition, a pulse signal is preferably applied simultaneously to the second electrodes of the first and second capacitors through corresponding first and second NMOS transistors so that the first and second capacitors are polarized to an initial domain after an inactivation of the third and fourth word lines.

Preferably, when the top memory cell array and the bottom reference cell array are activated, the bottom memory cell array and the top reference cell array are deactivated; and when the bottom memory cell array and the top reference cell array are activated, the top memory cell array and the bottom reference cell array are deactivated.

According to yet another aspect of this invention, a ferroelectric random access memory device is provided that comprises a first bit line, a memory cell coupled to the first bit line, wherein the memory cell comprises a first ferroelectric capacitor having a first electrode coupled to a first plate line, and a first transistor having a gate coupled to a first word line, and having a current path formed between the first bit line and a second electrode of the first ferroelectric capacitor, a second bit line corresponding to the first bit line, a reference cell coupled to the second bit line, wherein the reference cell comprises a second ferroelectric capacitor having a first electrode coupled to a second plate line, and a second transistor having a gate coupled to a second word line, and having a current path formed between the second bit line and a second electrode of the second ferroelectric capacitor, a sense amplifier coupled to the first and second bit lines, for sensing a voltage difference between the first and second bit lines, a third ferroelectric capacitor having a first electrode coupled to a third plate line, a third transistor having a gate coupled to a third word line, and having a current path formed between the first bit line and a second electrode of the third ferroelectric capacitor, a fourth ferroelectric capacitor having a first electrode coupled to a fourth plate line, and a fourth transistor having a gate coupled to a fourth word line, and having a current path formed between the second bit line and a second electrode of the fourth ferroelectric capacitor.

A pulse signal is preferably applied simultaneously to second electrodes of the third and fourth ferroelectric capacitors through corresponding NMOS transistors so that the first and second capacitors are polarized to an initial domain after an inactivation of the third and fourth word lines.

According to still another aspect of this invention, a read method is provided for a ferroelectric random memory device that comprises a bit line, a word line, a reference bit line, a reference word line, a memory cell arranged at an intersection of the word line and the bit line, and a reference cell arranged at an intersection of the reference word line and the reference bit line. The method includes activating the memory cell such that it is electrically coupled to the bit line, activating the reference cell such that it is electrically coupled to the reference bit line, supplying the bit line and the reference bit line with the same amount of charge so that respective voltages of the bit line and the reference bit line are increased, and sensing a voltage difference between the bit line and the reference bit line.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

Figure 2:
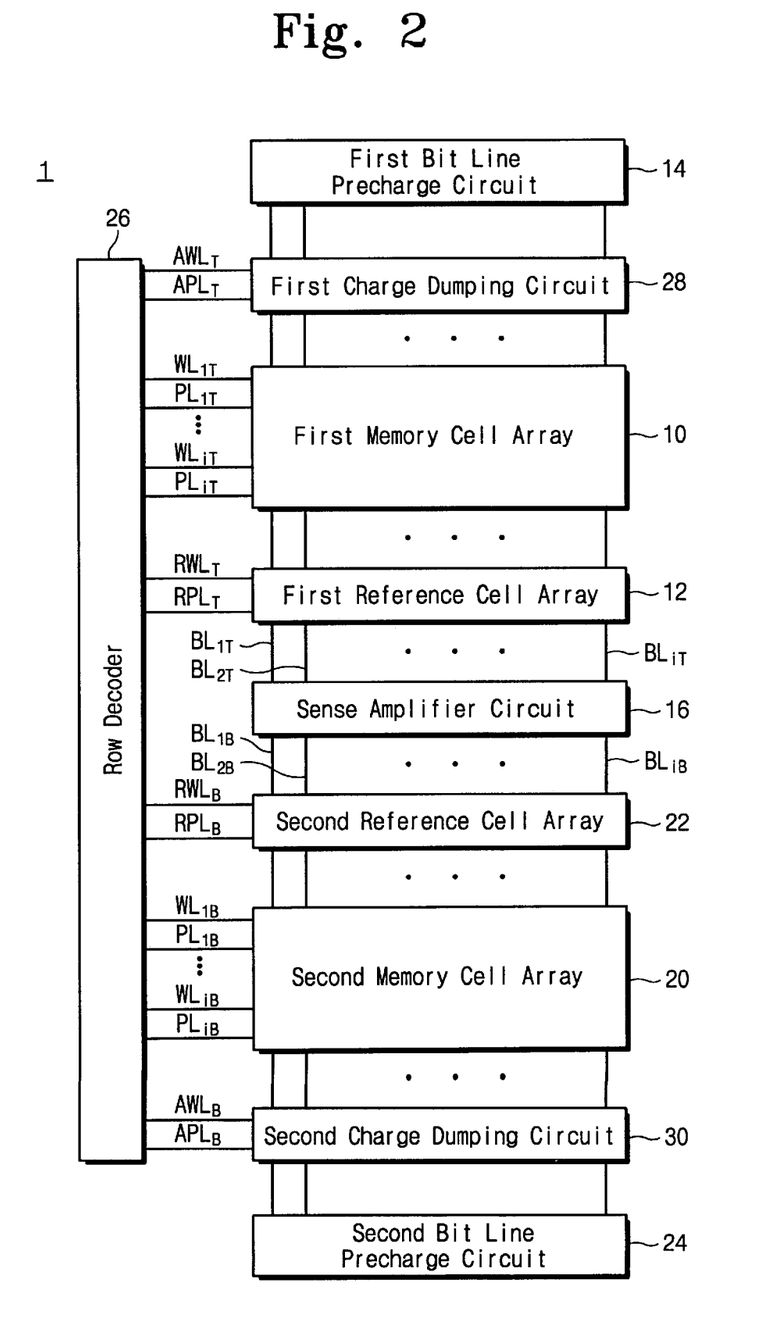
FIG. 2 shows a ferroelectric random access memory device according to a preferred embodiment of the present invention.

FIG. 2 shows a block diagram of a ferroelectric random memory device according to a preferred embodiment of the present invention. The ferroelectric random memory device of the invention adapts an open bit line scheme well-known to one skilled in the art, but it can also be adapted to a folded bit line scheme, which is disclosed in U.S. Pat. No. 5,541,872, entitled "FOLDED BIT LINE FERROELECTRIC MEMORY DEVICE," which is hereby incorporated by reference.

The present invention will be described by use of such a destructive read-out (DRO) type ferroelectric random access memory device as data stored in a memory cell is destroyed (or lost) during a sensing operation. However, the scope of the present invention can be applied to such a non-destructive read-out (NDRO) type as data stored in which a memory cell is not destroyed (or lost) during the sensing operation. The NDRO type FRAM device is disclosed in U.S. Pat. No. 5,753,949 under the title of "FERROELECTRIC MEMORY." The basic structure and operation for an NDRO type FRAM cell are described in detail in the U.S. Pat. No. 5,753,949. Other NDRO type FRAMs are disclosed in U.S. Pat. No. 5,345,414 under the title of "SEMICONDUCTOR MEMORY DEVICE HAVING FERROELECTRIC FILM" and in U.S. Pat. No. 5,519,812 under the title of "FERROELECTRIC ADAPTIVE-LEARNING TYPE PRODUCT-SUM OPERATIONELEMENTAND CIRCUIT USING SUCHELEMENT," all of which are hereby incorporated by reference.

Referring to FIG. 2, the FRAM device 1 comprises a first memory cell array 10, a first reference cell array 12, and a first bit line precharge circuit 14, a sense amplifier circuit 16, a second memory cell array 20, a second reference cell array 22, and a second bit line precharge circuit 24, a row decoder circuit 26, a first charge dumping circuit 28, and a second charge dumping circuit 30.

The first memory cell array 10, the first reference cell array 12, and the first bit line precharge circuit 14 are arranged at a top side of the sense amplifier circuit 16 and are tied to a plurality of top bit lines $BL_{1T}$ to $BL_{iT}$ (where i is an integer greater than 2). The first memory cell array 10 includes a plurality of top word lines $WL_{1T}$ to $WL_{iT}$, and a plurality of top plate lines $PL_{1T}$ to $PL_{iT}$ that each correspond to the word lines $WL_{1T}$ to $W_{iT}$. The first reference cell array 12 includes a top reference word line $RWL_T$, and a top reference plate line $RPL_T$ that corresponds to the top reference word line $RWL_T$.

The second memory cell array 20, the second reference cell array 22, and the second bit line precharge circuit 24 are arranged at a bottom side of the sense amplifier circuit 16 and are coupled to a plurality of bottom bit lines $BL_{1B}$ to $BL_{iB}$, which each correspond to the plurality of top bit lines $BL_{1T}$ to $BL_{iT}$, respectively. The second memory cell array 20 includes a plurality of bottom word lines $WL_{1B}$ to $WL_{iB}$, and a plurality of bottom plate lines $PL_{1B}$ to $PL_{iB}$ that each correspond to the plurality of bottom word lines $WL_{1B}$ to $WL_{iB}$. The second reference cell array 22 includes a bottom reference word line $RWL_B$, and a bottom reference plate line $RPL_B$ that corresponds to the bottom reference word line $RWL_B$.

According to above-mentioned configuration, when the first memory cell array 10 is selected by the row decoder circuit 26, the second memory cell array 20 and the first reference cell array 12 are thereby deselected. At this time, the second reference cell array 22 serves as a circuit for supplying the bottom bit lines $BL_{1B}$ to $BL_{iB}$ with the reference voltages required during a sensing operation. In comparison, when the second memory cell array 20 is selected by the row decoder circuit 26, the first memory cell array 10 and the second reference cell array 22 are thereby deselected. The first reference cell array 12 then supplies the top bit lines $BL_{1T}$ to $BL_{iT}$ with reference voltages. The first bit line precharge circuit 14 precharges the top bit lines $BL_{1T}$ to $BL_{iT}$ to a predetermined is voltage (e.g., a ground voltage) before the sensing operation. Similarly, the second bit line precharge circuit 24 precharges the bottom bit line $BL_{1B}$ to $BL_{iB}$ to the predetermined voltage before the sensing operation.

An example of the row decoder circuit 26 is disclosed in U.S. Pat. No. 5,218,566, entitled "DYNAMIC ADJUSTING REFERENCE VOLTA GE FOR FERROELECTRIC CIRCUITS", which is hereby incorporated by reference.

The first charge dumping circuit 28 is coupled to the top bit lines $BL_{1T}$ to $BL_{iT}$, and has its own top charge dumping word line $AWL_T$ and top charge dumping plate line $APL_T$. When the first charge dumping circuit 28 is activated during the sensing operation, charges are supplied to the top bit lines $BL_{1T}$ to $BL_{iT}$ from the circuit 28, so that a voltage of each of the top bit lines $BL_{1T}$ to $BL_{iT}$ is increased. Similarly, the second charge dumping circuit 30 is coupled to the bottom bit lines $BL_{1B}$ to $BL_{iB}$, and has its own bottom charge dumping word line $AWL_B$ and bottom charge dumping plate line $APL_B$.

When the second charge dumping circuit 30 is activated during the sensing operation, the same amount of charges as that supplied to the top bit lines $BL_{1T}$ to $BL_{iT}$ from the circuit 28 is supplied to the bottom bit lines $BL_{1B}$ to $BL_{iB}$ from the circuit 30, so that a voltage of each of the bottom bit lines $BL_{1B}$ to $BL_{iB}$ is increased. The first and second charge dumping circuits 28 and 30 are preferably designed so as to be simultaneously activated during the sensing operation associated with a selected memory cell array.

The FRAM device 1 of the present invention prevents a malfunction of the sense amplifier circuit 16 owing to a reduction of the amount of charge induced on a bit line by correspondingly increasing the voltages of the bit lines $BL_{1T}$ to $BL_{iT}$ and $BL_{1B}$ to $BL_{iB}$.

Figure 3:
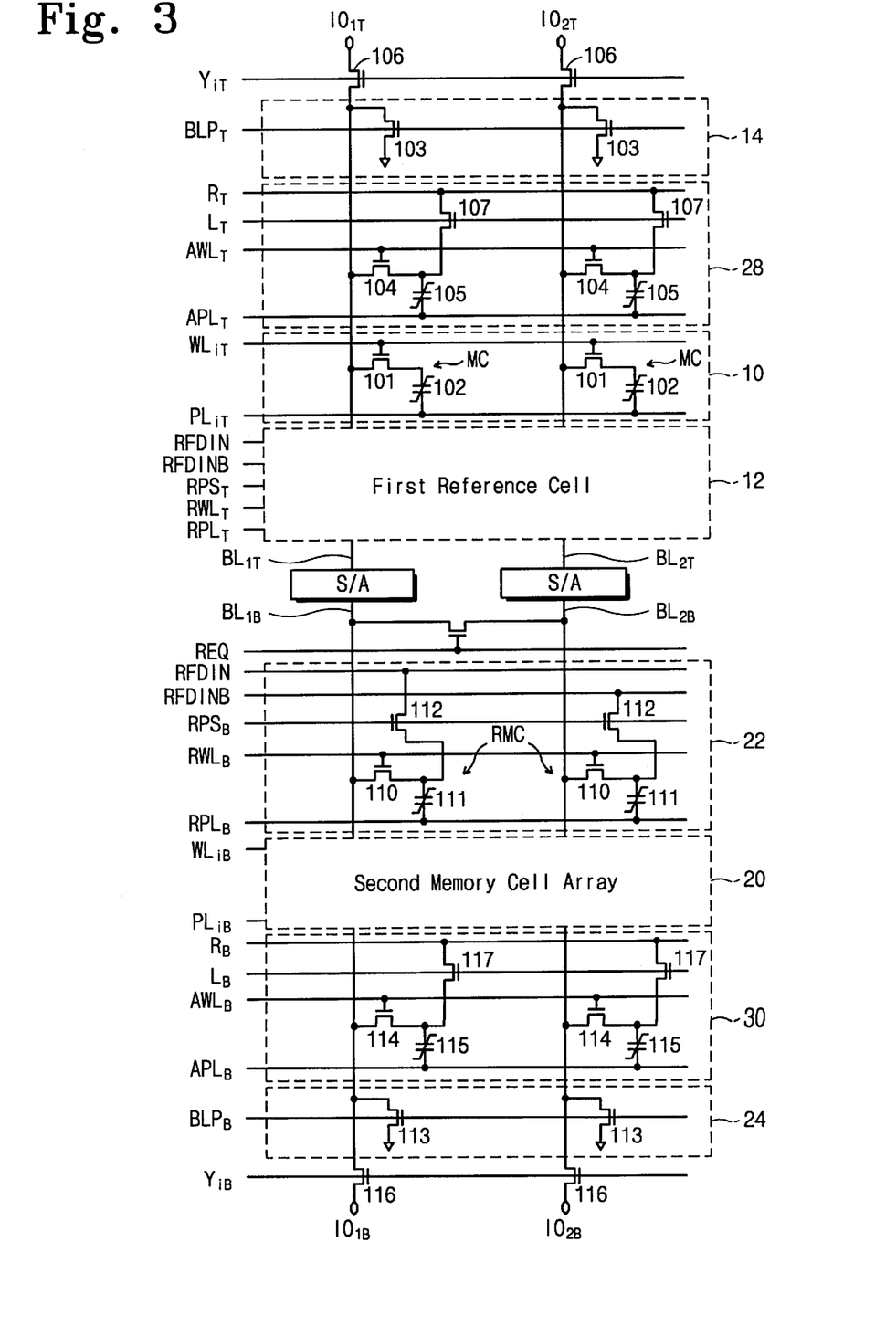
FIG. 3 is a detailed circuit diagram showing both first and second charge dumping circuits and a part of both a first memory cell array and a second reference cell array according to the preferred embodiment of the present invention.

The first and second charge dumping circuits 28 and 30 will be more fully described below. Referring to FIG. 3, a detailed circuit diagram showing both first and second charge dumping circuits 28 and 30 and a part of both the first memory cell array and the second reference cell array 22 according to the preferred embodiment of the present invention is illustrated. Although in FIG. 3, components associated with only four bit lines $BL_{1T}$, $BL_{2T}$, $BL_{1B}$, and $BL_{2B}$ are depicted, those associated with the remaining bit lines would be identical to those shown in FIG. 3.

For descriptive convenience, components associated with a pair of top and bottom bit lines $BL_{1T}$ and $BL_{1B}$ are explained. As shown in FIG. 3, the first memory cell array 10 has an 1T/1C type memory cell MC consisting of a top memory access transistor 101 and a top memory ferroelectric capacitor 102. The top memory access transistor 101 has a first current electrode coupled to the top bit line $BL_{1T}$, a gate connected to a corresponding top word line $WL_{iT}$ and a second current electrode connected to a top plate line $PL_{iT}$ via the top memory ferroelectric capacitor 102.

A top precharge NMOS transistor 103 of the first bit line precharge circuit 14 has a current path formed between the top bit line $BL_{1T}$ and a ground voltage, and is switched on or off by a top control signal $BLP_T$.

The first charge dumping circuit 28 according to the present invention comprises first and second top charge dumping NMOS transistors 104 and 107 and a top charge dumping ferroelectric capacitor 105, corresponding to a top bit line $BL_{1T}$. The first top charge dumping NMOS transistor 104 has a gate coupled to the top charge dumping word line $AWL_T$, has a first current electrode coupled to the bit line $BL_{1T}$, and a second current electrode coupled to a first electrode of the top charge dumping ferroelectric capacitor 105. The first electrode of the top charge dumping ferroelectric capacitor 105 is coupled to a first signal line $R_T$ through the second top charge dumping NMOS transistor 107, which is controlled by the second signal line $L_T$. The second electrode of the top charge dumping ferroelectric capacitor 105 is connected to the top charge dumping plate line $APL_T$. It would be obvious to one skilled in the art that a first and second top charge dumping NMOS transistors 104 and 107 and a top charge dumping ferroelectric capacitor 105 would be provided in the first charge dumping circuit 28 to correspond to the remaining bit lines $BL_{2T}$ to $BL_{iT}$, respectively.

The transistor 106 and the signal $Y_{iT}$ are related to the column select, and $IO_{1T}$ and $IO_{2T}$ indicate input/output (I/O) lines, as would be understood to one skilled in the art.

With reference to FIG. 3, the second reference cell array 22 has a pair of reference cells RMC each consisting of first and second bottom reference NMOS transistors 110 and 112 and a bottom reference ferroelectric capacitor 111. In this embodiment, the bottom reference ferroelectric capacitors 111 corresponding to the bottom bit lines $BL_{1B}$ and $BL_{2B}$ have different polarization states from each other (corresponding to the points B and D from FIG. 1), but have the same size as those of the first memory cell array 10.

The first bottom reference access transistor 110 has a gate connected to a bottom reference word line $RWL_B$, has a first current electrode connected to the bottom bit line $BL_{1B}$, and has a second current electrode coupled to the bottom reference plate line $RPL_B$ through the bottom reference ferroelectric capacitor 111. The bottom reference ferroelectric capacitor 111 has its first electrode coupled to the second current electrode of the first bottom reference access transistor 110, and its second electrode coupled to the bottom reference plate line $RPL_B$. The second bottom reference access NMOS transistor 112 has its first current electrode coupled to the first electrode of the first bottom reference ferroelectric capacitor 111, has its second current electrode tied to a line $RFD_{1N}/RFD_{1NB}$, and is switched on/off by a reference control signal $RPS_B$. Although not shown in FIG. 3, the reference cells RMC thus connected are provided between each of the bit lines, e.g., $BL_{1T}$ and $BL_{2T}$, respectively.

As with the first bit line precharge circuit 14, a bottom precharge NMOS transistor 113 of the second bit line precharge circuit 24 has a first current electrode coupled to the bit line $BL_{1B}$, a second current electrode grounded, and a gate coupled to a bottom control signal $BLP_B$.

Successively, as shown in FIG. 3, the second charge dumping circuit 30 is provided at the bottom side where the bottom bit lines $BL_{1B}$ and $BL_{2B}$ are arranged. The second charge dumping circuit 30 according to the present invention comprises first and second bottom charge dumping NMOS transistors 114 and 117 and a bottom charge dumping ferroelectric capacitor 115 that corresponds to the bit line $BL_{1B}$. The first bottom charge dumping NMOS transistor 114 has its gate coupled to a word line $AWL_B$, has its first current electrode coupled to the bit line $BL_{1B}$, and has its second current electrode coupled to the bottom charge dumping plate line $APL_B$ via the bottom charge dumping ferroelectric capacitor 115. The bottom charge dumping ferroelectric capacitor 115 has its first electrode coupled to a first bottom signal line $R_B$ through the second bottom charge dumping NMOS transistor 117, which is controlled by a second bottom signal line $L_B$. It would be obvious to one skilled in the art that first and second bottom charge dumping NMOS transistors 114 and 117 and bottom charge dumping ferroelectric capacitors 115 are provided in the second charge dumping circuit 30 to correspond to remaining bit lines $BL_{2B}$ to $BL_{iB}$, respectively.

A sense amplifier SA is connected between each pair of top and bottom bit lines $BL_{1T}$ and $BL_{1B}$, and $BL_{2T}$ and $BL_{2B}$. This sense amplifier SA senses and amplifies a voltage difference between corresponding pair of bit lines. Although not shown in FIG. 3, it is obvious that elements (or circuit patterns) which are identical to components associated with the bit lines $BL_{1T}$, $BL_{1B}$, $BL_{2T}$, and $BL_{2B}$ are repeated for each of the remaining bit lines $BL_{nT}$ and $B1_{nB}$ (where n=3 to i).

Also, the first reference cell array 12 preferably has a similar configuration to that of the second reference cell array 22 of FIG. 3, and is preferably arranged at the top side of the sense amplifier circuit 16. Similarly, the second memory cell array 20 preferably has a similar configuration to that of the first memory cell array 10 of FIG. 3, and is preferably arranged at the bottom side of the sense amplifier circuit 16.

The transistor 116 and the signal $Y_{iB}$ are related to the column select, and $IO_{1B}$ and $IO_{2B}$ indicate input/output (I/O) lines, as would be understood to one skilled in the art.

Figure 4:
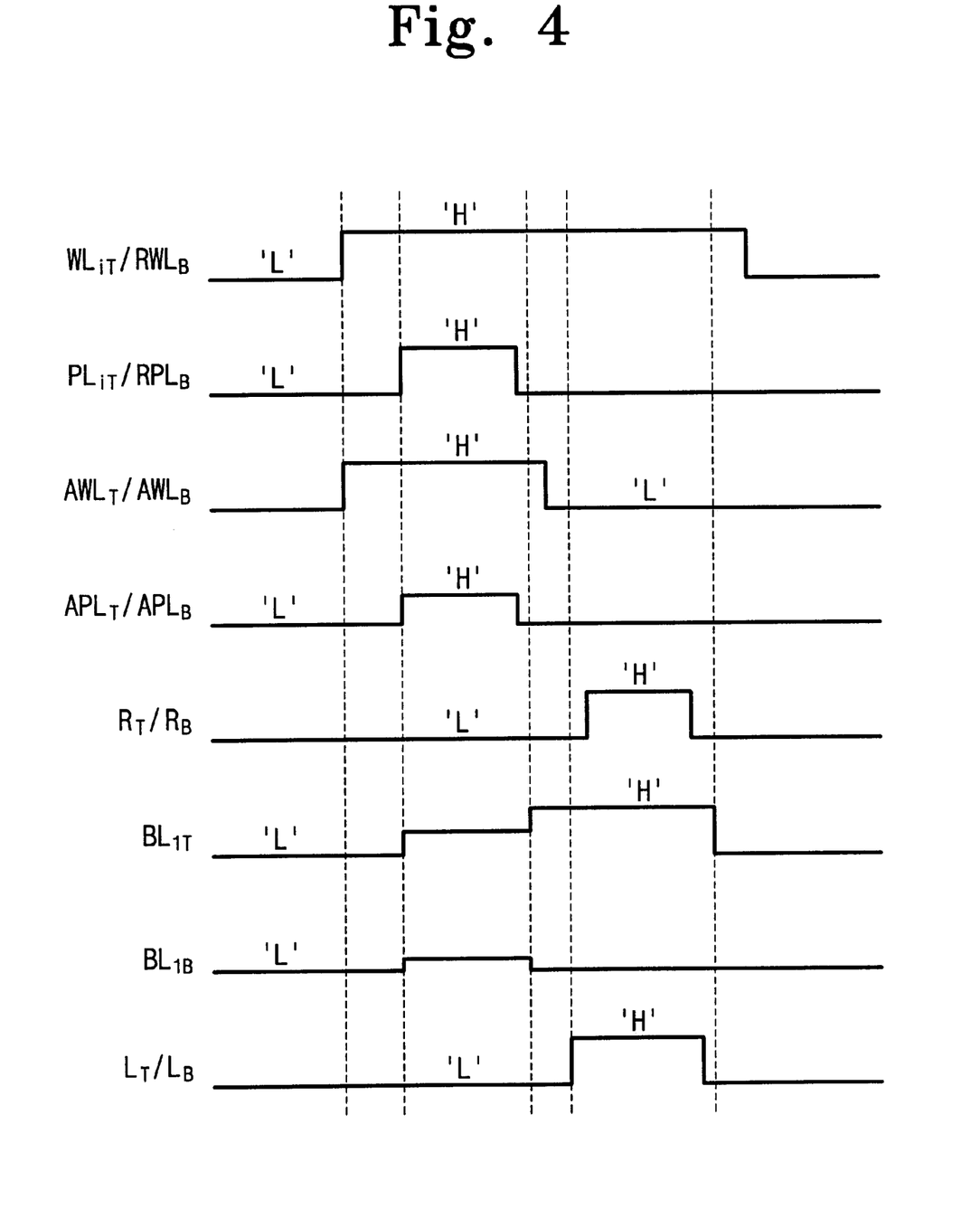
FIG. 4 is a timing diagram for describing a read operation of the preferred embodiment of the present invention.

FIG. 4 is a timing diagram for describing a read operation according to the present invention. Below, the read operation of the present invention will be more fully described with reference to FIGS. 1, 3 and 4. Assume that the top and bottom charge dumping ferroelectric capacitors 105 and 115 of the first and second charge dumping circuits 28 and 30 have the polarization state (i.e., point B) corresponding to a logical data "1", respectively.

At an initial stage of the read operation of the FRAM, an operation for sensing data stored in memory cells is carried out. Before the sensing operation, the bit lines $BL_{1T}$, $BL_{2T}$, $BL_{1B}$, and $BL_{2B}$ are precharged through the first and second precharge circuits 14 and 24 when the signals $BLP_T$ and $BLP_B$ are activated at a high level. After this, the sensing operation starts to be carried out, and the bit lines $BL_{1T}$, $BL_{2T}$, $BL_{1B}$, and $BL_{2B}$ are floated during the sensing operation.

Then, when the word line $WL_{iT}$ of the first memory cell array 10 and the reference word line $RWL_B$ of the second reference cell array 22 are activated, as illustrated in FIG. 4, the top and bottom memory access transistors 101 and 110 coupled to the word line $WL_{iT}$ and the reference word line $RWL_B$ are turned on, so that the first electrodes of the top memory ferroelectric capacitor 102 and the bottom reference capacitor 111 are coupled to the corresponding bit lines $BL_{1T}$, $BL_{2T}$, $BL_{1B}$ and $BL_{2B}$, respectively. At the same time, the word lines $AWL_T$ and $AWL_B$ are activated, so that electrodes of the top and bottom charge dumping ferroelectric capacitors 105 and 115 of the first and second charge dumping circuits 28 and 30 are connected to the corresponding bit lines $BL_{1T}$, $BL_{2T}$, $BL_{1B}$ and $BL_{2B}$, respectively.

When the plate line $PL_{iT}$ coupled to the memory cells MC of the first memory cell array 10 each of which stores a logical data "1", is activated to a high level, the degree of polarization of the respective top memory ferroelectric capacitors 102 is varied from the point B to the point D through the point C. As a result, a charge amount of $dQ_1$ is transmitted from the top memory ferroelectric capacitors 102 to the corresponding bit lines $BL_{1T}$ and $BL_{2T}$. Herein, the charge amount from the respective top memory ferroelectric capacitors 102 is labeled with $Q_m$. And, as the plate line $RPL_T$ and the signal REQ are activated high, the bit lines $BL_{1B}$ and $BL_{2B}$ are charged with reference voltages, respectively.

Similarly, when the plate lines $APL_T$ and $APL_B$ are activated, the degree of polarization of the respective top and bottom charge dumping ferroelectric capacitors 105 and 115 is varied from the point B to the point D via the point C. Accordingly, a charge amount of $dQ_1$ is transmitted from the top and bottom charge dumping ferroelectric capacitors 105 and 115 to the corresponding bit lines $BL_{1T}$, $BL_{2T}$, $BL_{1B}$, and $BL_{2B}$. Herein, the charge amount from the respective top and bottom charge dumping ferroelectric capacitors 105 and 115 is labeled with $Q_a$.

As a result of the above described operation, the total amount of charge $Q_t$ induced on the respective bit lines $BL_{1T}$ and $BL_{2T}$ corresponds to $Q_m + Q_a$. Therefore, the voltage on the respective bit lines $BL_{1T}$, $BL_{2T}$, $BL_{1B}$, and $BL_{2B}$ is more greatly increased compared with the case when the first and second charge dumping circuits 28 and 30 are not provided in the FRAM device 1.

Then, the voltages of the bit lines $BL_{1T}$ and $BL_{2T}$ are compared with the reference voltages of the bit lines $BL_{1B}$ and $BL_{2B}$ by means of the corresponding sense amplifiers SA, respectively. If the bit line voltage is more than the reference voltage, it is increased up to an operational voltage level (i.e., $V_{cc}$ level) by the corresponding sense amplifier SA. If the bit line voltage is not more than the reference voltage, the bit line voltage is lowered again to zero voltage by the corresponding sense amplifier SA. At this time, since the bit lines $BL_{1T}$ and $BL_{2T}$ are increased up to the operational voltage level (i.e., $V_{cc}$ level), the respective top memory ferroelectric capacitors 102 are switched at an initial domain, respectively. In other words, the degree of polarization of the respective top memory ferroelectric capacitors 102 is again varied from the point D to the point B via the point A during an activation of the word line $WL_{iT}$. As illustrated in FIG. 4, after the word lines $AWL_T$ and $AWL_B$ are deactivated to a low level, the signals $R_T$, $R_B$, $L_T$ and $L_B$ are activated to a high level, so that the degree of polarization of the top and bottom charge dumping ferroelectric capacitors 105 and 115 is again varied from the point D to the point B via the point A.

In accordance with the above described sensing operation of the present invention, the voltages induced on the bit lines $BL_{1T}$, $BL_{2T}$, $BL_{1B}$ and $BL_{2B}$ are increased in proportion to the charge amount $Q_a$, which is transmitted from the first and second charge dumping circuits 28 and 30 to the corresponding bit lines $BL_{1T}$, $BL_{2T}$, $BL_{1B}$ and $BL_{2B}$, respectively. The voltage $V_b$ of each bit line $BL_{1T}$, $BL_{2T}$, $BL_{1B}$ and $BL_{2B}$ is expressed by equation (2).

$$V_b = \frac{(Q_m + Q_a)}{C_b} \quad (2)$$

Therefore, although the dimensions of the ferroelectric capacitors of the memory cells MC and the reference memory cells RMC are reduced as the integration degree of the FRAM device 1 increases, the voltages induced on the bit lines $BL_{1T}$, $BL_{2T}$, $BL_{1B}$ and $BL_{2B}$ are not affected by the potential variation of adjacent signal lines (e.g., the bit lines, the word lines, and the plate lines), since the charge amount $(Q_a + Q_m)$ is increased.

In the exemplary preferred embodiment, described above, although the first and second charge dumping circuits 28 and 30 use the ferroelectric capacitors, a linear capacitor can also be used therein. In this case, the signal lines $R_T$, $R_B$, $L_T$, and $L_B$ and the second top and bottom charge dumping NMOS transistors 107 and 117 for changing the polarization state of the respective ferroelectric capacitors of the circuits 28 and 30 are removed from the first and second charge dumping circuits 28 and 30. When a linear capacitor is employed, it would be obvious to one skilled in the art that the same effect as described above can be obtained.

The invention has been described using the exemplary preferred embodiment. However, it is understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A random access memory device comprising:
    a top bit line;
    a top memory cell coupled to the top bit line;
    a bottom bit line corresponding to the top bit line;
    a sense amplifier coupled to the top and bottom bit lines, for sensing a voltage difference between the top and bottom bit lines; and
    a circuit for increasing a voltage of the top and bottom bit lines, before the sense amplifier is activated.

2. A random access memory device, as recited in claim 1, wherein the top memory cell comprises a ferroelectric capacitor.

3. A random access memory device, as recited in claim 1, wherein the circuit for increasing a voltage comprises:
   a first capacitor having a first electrode coupled to a first plate line;
   a first transistor having a first current path formed between the top bit line and a second electrode of the first capacitor, and a gate coupled to a first word line;
   a second capacitor having a first electrode coupled to a second plate line; and
   a second transistor having a current path formed between the bottom bit line and a second electrode of the second capacitor, and a gate coupled to a second word line.

4. A random access memory device, as recited in claim 3, wherein the first and second capacitors each comprise a capacitor selected from the group of a ferroelectric capacitor and a linear capacitor.

5. A random access memory device, as recited in claim 4, wherein when the first and second capacitors comprise ferroelectric capacitors, a pulse signal is simultaneously applied to the second electrodes of the first and second capacitors through corresponding first and second NMOS transistors after an inactivation of the first and second word lines, so that the first and second capacitors are polarized to an initial domain.

6. A random access memory device, as recited in claim 3, wherein the first and second word lines are simultaneously activated during a sensing operation.

7. A random access memory device, as recited in claim 6, wherein the first and second plate lines are simultaneously activated during an activation of the first and second word lines.

8. A random access memory device, as recited in claim 1, further comprising
   a bottom reference cell that is coupled to the bottom bit line and which provides the bottom bit line with a reference voltage.

9. A random access memory device, as recited in claim 8, further comprising:
   a bottom memory cell coupled to the bottom bit line; and
   a top reference cell that is coupled to the top bit line and which provides the top bit line with a reference voltage,
   wherein when the top memory cell and the bottom reference cell are activated, the bottom memory cell and the top reference cell are deactivated, and
   wherein when the bottom memory cell and the top reference cell are activated, the top memory cell and the bottom reference cell are deactivated.

10. A random access memory device comprising:
    a top memory cell array having a plurality of top word lines, a plurality of top bit lines, and a plurality of top memory cells arranged in a matrix form between the top word lines and the top bit lines;
    a plurality of bottom bit lines corresponding to the top bit lines;
    a bottom reference cell array having a plurality of bottom reference cells commonly coupled to a bottom reference word line, for generating first reference voltages to be supplied into the bottom bit lines;
    a row decoder circuit for selecting a top word line related to a memory cell to be selected and the bottom reference word line in response to address signals;
    a sense amplifier circuit connected to the top and bottom bit lines, for sensing a voltage difference between corresponding top and bottom bit lines; and
    a charge dumping circuit for supplying the top and bottom bit lines with the same amount of charge before the sense amplifier circuit performs a sensing operation.

11. A random access memory device, as recited in claim 10, further comprising
    a bottom memory cell array connected to the bottom bit lines and having a plurality of bottom word lines and a plurality of bottom memory cells arranged in a matrix form between the bottom word lines and the bottom bit lines; and
    a top reference cell array connected to the top bit lines and having a plurality of top reference cells commonly coupled to a top reference word line, for generating second reference voltages to be supplied into the top bit lines, respectively.

12. A random access memory device, as recited in claim 11, wherein the top and bottom memory cells and the top and bottom reference cells each comprise a ferroelectric capacitor.

13. A random access memory device, as recited in claim 11, wherein the charge dumping circuit comprises a first charge dumping portion coupled to the first bit lines and a second charge dumping portion coupled to the second bit lines.

14. A random access memory device, as recited in claim 12,
    wherein the first charge dumping portion comprises a plurality of first capacitors and a first plurality of access transistors, corresponding to the plurality of first bit lines,
    wherein each of the first capacitors has a first electrode coupled to a first plate line, and
    wherein each of the first access transistors has a current path formed between a corresponding first bit line and a second electrode of a corresponding first capacitor, and has a gate coupled to a third word line.

15. A random access memory device, as recited in claim 13,
    wherein the second charge dumping portion comprises a plurality of second capacitors and a plurality of second access transistors, corresponding to the second bit lines,
    wherein each of the second capacitors has a first electrode coupled to a second plate line, and
    wherein each of the second access transistors has a current path formed between a corresponding second bit line and a second electrode of a corresponding second capacitor, and has a gate coupled to a fourth word line.

16. A random access memory device, as recited in claim 15,
    wherein each of the first and second capacitors comprises a ferroelectric capacitor, and
    wherein a pulse signal is simultaneously applied to the second electrodes of the first and second capacitors through corresponding first and second NMOS transistors so that the first and second capacitors are polarized to an initial domain after an inactivation of the third and fourth word lines.

17. A random access memory device, as recited in claim 11,
    wherein when the top memory cell array and the bottom reference cell array are activated, the bottom memory cell array and the top reference cell array are deactivated, and
    wherein when the bottom memory cell array and the top reference cell array are activated, the top memory cell array and the bottom reference cell array are deactivated.

* * * * *